United States Patent [19]
Maeda

[11] Patent Number: 5,626,782
[45] Date of Patent: May 6, 1997

[54] POSTEXPOSURE BAKING APPARATUS FOR FORMING FINE RESIST PATTERN

[75] Inventor: Hiroshi Maeda, Hyogo, Japan

[73] Assignee: Mitsubishi Denki Kabushiki Kaisha, Tokyo, Japan

[21] Appl. No.: 398,825

[22] Filed: Mar. 6, 1995

[30] Foreign Application Priority Data

Oct. 12, 1994 [JP] Japan ................... 6-246166

[51] Int. Cl.$^6$ ................... H05B 3/68; G03C 5/00
[52] U.S. Cl. ................... 219/449; 219/452; 430/325; 430/330
[58] Field of Search ................... 219/497, 443, 219/447, 448, 450, 451, 452, 482, 489, 490, 492; 430/325, 326, 328, 330

[56] References Cited

U.S. PATENT DOCUMENTS

| | | | |
|---|---|---|---|
| 4,212,935 | 7/1980 | Canavello et al. | 430/326 |
| 4,281,057 | 7/1981 | Casteillani et al. | 430/325 |
| 5,252,435 | 10/1993 | Tami et al. | 430/325 |
| 5,300,404 | 4/1994 | Tani et al. | 430/326 |
| 5,316,891 | 5/1994 | Hashimoto et al. | 430/325 |
| 5,474,872 | 12/1995 | Tomo et al. | 430/325 |

OTHER PUBLICATIONS

Przybilla et al., "Delay Time Stable Chemically Amplified Deep UV Resist," SPIE vol. 1925, pp. 76–91 Jan. 1993.

Ohfuji et al., "Dissolution Rate Modeling of a Chemically Amplified Positive Resist," SPIE vol. 1925, ppp. 213–227 Jan. 1993.

Primary Examiner—Teresa J. Walberg
Assistant Examiner—Sam Paik
Attorney, Agent, or Firm—Lowe, Price, LeBlanc & Becker

[57] ABSTRACT

A postexposure baking apparatus which is capable of controlling the dimension of a resist pattern forms the resist pattern without carrying out PEB immediately after exposure. A chemical amplification resist is formed on a wafer. The chemical amplification resist is selectively exposed to form a latent image of a resist pattern. In order to obtain a resist pattern with a prescribed line width or at a desired space, the chemical amplification resist is postexposure-baked by a hot plate under conditions which are decided on the basis of the relation between an elapsed time from the exposure to PEB and change of the line width or the space of the resist pattern as finished as to the chemical amplification resist. The chemical amplification resist is developed to obtain a fine resist pattern.

6 Claims, 20 Drawing Sheets

$D_1 > D_2$ $D_1 < D_2$ $\underline{\underline{D_1 < D_2}}$ $\underline{\underline{D_1 < D_3}}$ $$\underline{\underline{D_1 > D_3}}$$

$\underline{\underline{D_1 < D_3}}$

ELAPSED TIME FROM EXPOSURE TO PEB

PEB TIME OR PEB TEMPERATURE $\underline{\underline{D_1 = D_2}}$ 5,626,782

POSTEXPOSURE BAKING APPARATUS FOR FORMING FINE RESIST PATTERN

BACKGROUND OF THE INVENTION

1. Field of the Invention

The present invention generally relates to a method of forming a fine resist pattern, and more specifically, it relates to a method of forming a fine resist pattern which is improved to be capable of forming a fine resist pattern exceeding the performance of an apparatus therefor. The present invention also relates to a postexposure baking apparatus which can implement such a method.

2. Description of the Background Art

In relation to photolithography, a chemical amplification resist is now being proposed as a material having high sensitivity and high resolution. The feature of this resist resides in that a pattern forming reaction progresses through baking after exposure (hereinafter referred to as postexposure baking) with a catalyst of an acid which is generated during the exposure, to complete pattern imaging.

FIGS. 27 to 31 are sectional views of a semiconductor device showing respective steps of a conventional method of forming a fine resist pattern.

As shown in FIG. 27, a negative chemical amplification resist 1 (hereinafter referred to as a resist 1) is formed on a wafer 2. The resist 1 contains a base resin which contains hydroxyl groups, an acid generator which generates sulfonic acid by irradiation with an electron beam, and a cross-linking agent which reacts with the hydroxyl groups contained in the base resin by a catalytic action of a proton of the sulfonic acid, thereby bridging the base resin. In more concrete terms, the base resin is prepared from novolak resin shown in FIG. 32A, the cross-linking agent is prepared from hexamethylolmelamine hexamethylether shown in FIG. 32B, and the acid generator is prepared from triphenylsulfonium triflate shown in FIG. 32C respectively.

As shown in FIG. 28, the chemical amplification resist 1 is selectively irradiated with an electron beam 4 of 20 KeV in energy at an exposure value of 1 to $10 \times 10^{-6}$ C/cm², and separated into an exposed part 51 and unexposed parts 50. In the exposed part 51, the triphenylsulfonium triflate decomposes along a reaction formula shown in FIG. 33, to generate trifluoromethanesulfonic acid which is a strong acid.

Then, a hot plate 11 is employed for carrying out baking after exposure (postexposure baking: hereinafter referred to as PEB) at 50° to 150° C. for 2 minutes, as shown in FIG. 29. The state of bridging of the base resin in the exposed part 51 of the resist 1 which is caused by this PEB is now described with reference to FIGS. 34(a) to 34(e).

Referring to FIG. 34(a), the chemical amplification resist 1 is irradiated with the electron beam 4. Upon such irradiation of the chemical amplification resist 1 with the electron beam 4, the triphenylsulfonium triflate decomposes to generate an acid (H⁺), as shown in FIG. 34(b). When this resist 1 is baked, the base resin is partially bridged through the acid (H+) serving as a catalyst as shown in FIG. 34(c), to by-produce the acid (H⁺). The base resin is further chain-reactionally bridged successively through the by-produced acid (H⁺) serving as a catalyst, as shown in FIG. 34(d). Due to this chain reaction, the base resin is bridged in the form of a network as shown in FIG. 34(e). FIG. 35 shows reaction formulas of the aforementioned chain reaction.

As shown in FIG. 30, the resist 1 is baked to be separated into a bridged part 1a and unbridged parts 1b. Referring to FIGS. 30 and 31, the resist 1 is exposed to form a fine resist pattern (1a).

As hereinabove described, the chemical amplification resist 1 is baked after the exposure so that a pattern forming reaction progresses through the acid which is generated during the exposure for serving as a catalyst, to complete pattern imaging. Therefore, the pattern shape is extremely changed by diffusion of the acid as generated in the resist 1. Further, an alkaline substance contained in the air may adhere to the surface of the resist 1 or the acid as generated is neutralized and deactivated by alkali coming from the underlayer (2), to extremely change the pattern shape.

In order to prevent such change of the pattern shape caused by diffusion or deactivation of the acid, the PEB is generally carried out immediately after the exposure, to thereafter perform development. Referring to FIGS. 28 and 31, an exposed dimension $D_1$ and a finished dimension $D_2$ are equal to each other when the PEB and the development are carried out immediately after the exposure. In this case, the exposed dimension $D_l$ is the finished dimension $D_2$ as required, and hence it is impossible to form a fine pattern exceeding the performance of an apparatus therefor. In other words, a pattern which is finer than the minimum resolution cannot be formed in the prior art.

In the aforementioned conventional method, further, the time margin for the process is extremely small since the PEB must be immediately carried out after the exposure.

SUMMARY OF THE INVENTION

The present invention has been proposed in order to solve the aforementioned problems, and an object thereof is to provide a method which is so improved as to form a finer resist pattern than the finest one which can be attained by an apparatus therefor.

Another object of the present invention is to provide a method of forming a fine resist pattern which is improved to be capable of increasing the time margin for the process.

Still another object of the present invention is to provide a postexposure baking apparatus which is improved to be capable of implementing the aforementioned method of forming a fine resist pattern.

In a method of forming a fine resist pattern according to a first aspect of the present invention, first prepared is such a chemical amplification resist that the line width or a space of a finished resist pattern is varied with an elapsed time from exposure to postexposure baking. Then obtained is the relation between the elapsed time from the exposure to the postexposure baking and change of the line width or the space of the finished resist pattern as to the chemical amplification resist. The chemical amplification resist is formed on a wafer. This chemical amplification resist is selectively exposed to form a latent image of the resist pattern. In order to obtain a resist pattern having a desired line width or a desired space, the chemical amplification resist is postexposure-baked under conditions which are decided on the basis of the relation between the elapsed time from the exposure to the postexposure baking and the change of the line width or the space of the resist pattern as finished. The chemical amplification resist is developed.

In a method of forming a fine resist pattern according to a second aspect of the present invention, first prepared is such a chemical amplification resist that the line width or a space of a finished resist pattern is varied with the temperature or the time for postexposure baking. Then obtained is the relation between the temperature or the time for the postexposure baking and change of the line width or the space of the finished resist pattern as to the chemical amplification resist. The chemical amplification resist is formed on a wafer. This chemical amplification resist is selectively exposed to form a latent image of the resist pattern. In order to obtain a resist pattern having a desired line width or a desired space, the chemical amplification resist is postexposure-baked under conditions which are decided on the basis of the relation between the temperature or the time for the postexposure baking and the change of the line width or the space of the resist pattern as finished. The chemical amplification resist is developed.

A postexposure baking apparatus according to a third aspect of the present invention comprises a hot plate for postexposure-baking an exposed chemical amplification resist. The apparatus also comprises first input means for inputting the relation between the elapsed time from the aforementioned exposure to the aforementioned postexposure baking and change of the line width or the space of the finished resist pattern as to the aforementioned chemical amplification in the apparatus. The apparatus further comprises second input means for inputting the relation between the temperature or the time for the aforementioned postexposure baking and change of the line width or the space of the finished resist pattern as to the aforementioned chemical amplification resist in the apparatus. The apparatus further comprises calculation means for calculating the temperature or the time for the aforementioned postexposure baking for obtaining a resist pattern having a desired line width or a desired space on the basis of the information inputted by the first input means and that inputted by the second input means. The apparatus further comprises control means for controlling the aforementioned hot plate to be capable of postexposure-baking the aforementioned chemical amplification resist at or for the temperature or the time obtained by the aforementioned calculation means.

In the method of forming a fine resist pattern according to the first aspect of the present invention, the aforementioned chemical amplification resist is postexposure-baked under the conditions which are decided on the basis of the relation between the elapsed time from the exposure to the postexposure baking and the change of the line width or the space of the finished resist pattern as to the chemical amplification resist for obtaining a resist pattern having a desired line width or a desired space, whereby it is possible to arbitrarily control the dimension of the resist pattern without performing the postexposure baking immediately after the exposure.

In the method of forming a fine resist pattern according to the second aspect of the present invention, the chemical amplification resist is postexposure-baked under the conditions which are decided on the basis of the relation between the temperature or the time for the postexposure baking and the change of the line width or the space of the finished resist pattern as to the chemical amplification resist for obtaining a resist pattern having a desired line width or a desired space, whereby it is possible to obtain a pattern which is finer than the minimum resolution obtained in performance of the apparatus.

In the postexposure baking apparatus according to the third aspect of the present invention, the chemical amplification resist can be baked at the temperature or for the time of the postexposure baking for obtaining a resist pattern having a desired line width or a desired space, whereby it is possible to arbitrarily control the dimension of the resist pattern without performing the postexposure baking immediately after the exposure, as well as to obtain a pattern which is finer than the minimum resolution obtained in performance of the apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Embodiment 1

FIGS. 1A to 1D are sectional views of a semiconductor device showing respective steps of a method of forming a fine resist pattern according to an embodiment 1 of the present invention.

First, prepared is a negative chemical amplification resist having such a property that the finished dimension of a pattern as formed is thinned through standing from exposure to PEB.

In order to bridge a base resin, a certain amount of acid is necessary. If acid concentration is smaller than the "certain amount", the base resin is not bridged. When the resist is left standing from exposure to PEB, an acid which is generated by light is transversely diffused.

Throughout the specification, such a resist that acid concentration is reduced below the aforementioned "certain amount" in an exposed part by the diffusion of the acid is referred to as a resist having such a property that the finished dimension of a pattern as formed is thinned by standing from exposure to PEB. Further, such a resist that acid concentration is sufficiently higher than the aforementioned "certain amount" in an exposed part and that in a diffused part is also higher than the aforementioned "certain amount" due to original generation of a sufficiently large amount of acid is also referred to as a resist having such a property that the finished dimension of a pattern as formed is thinned by standing from exposure to PEB.

Figure 1A:
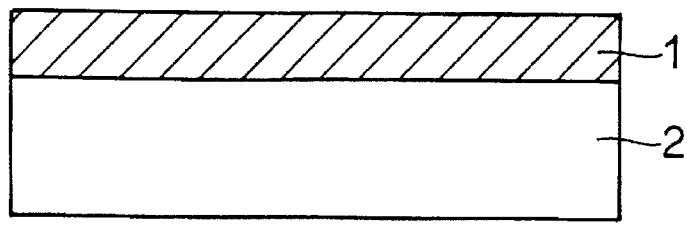
FIGS. 1A to 1D are sectional views of a semiconductor device showing respective steps of a method of forming a fine resist pattern according to an embodiment 1 of the present invention.

Referring to FIG. 1A, a negative chemical amplification resist having such a property that the finished dimension of a pattern as formed is thinned by standing from exposure to PEB (hereinafter simply referred to as a resist 1) is applied onto a wafer 2.

Figure 1B:
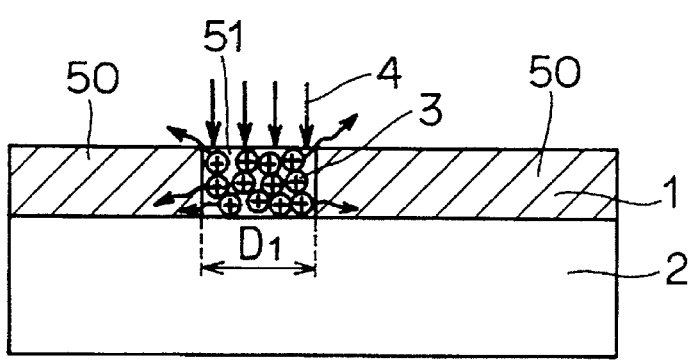
Figure 34:
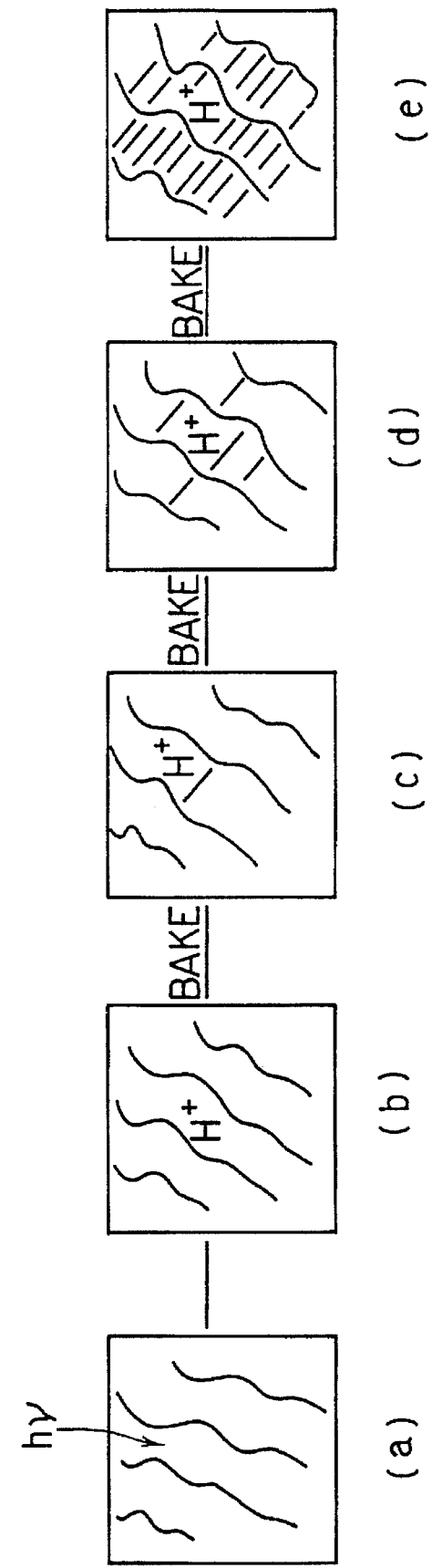
FIG. 34 illustrates a state of bridging of a base resin in an exposed part of the chemical amplification resist.
Figure 35:
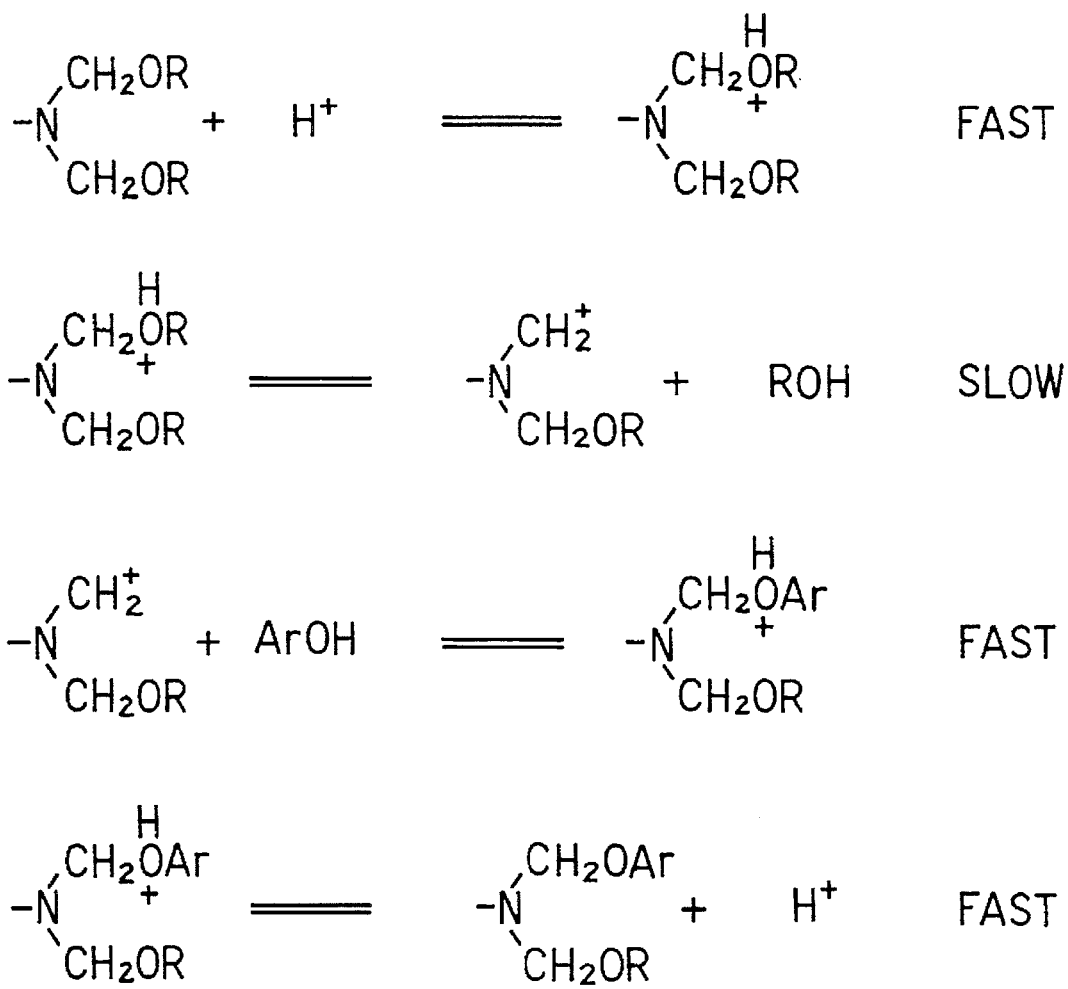
FIG. 35 illustrates reaction formulas as to bridging of the base resin.

Referring to FIG. 1B, the resist 1 is selectively irradiated with an electron beam 4, and separated into an exposed part 51 and unexposed parts 50. At this time, an acid 3 is generated in the exposed part 51 through a reaction shown in FIG. 34. While PEB is thereafter carried out, the acid 3 is transversely diffused when the resist 1 is left standing from the exposure to the PEB. Due to this diffusion, there remains no acid of an amount which is necessary for bridging the resist 1 in an end portion of the exposed part 51, in the resist 1 employed in this embodiment.

Figure 1C:
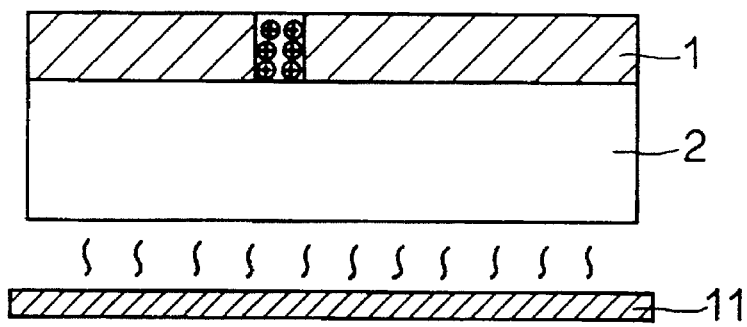

Referring to FIG. 1C, the resist 1 is postexposure-baked (PEB) through a hot plate 11.

Figure 1D:
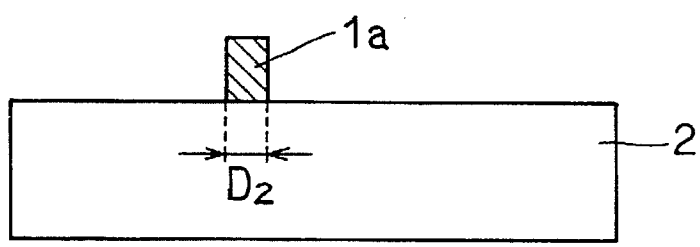

Referring to FIG. 1D, the resist 1 is so developed as to obtain a resist pattern 1a having a dimension $D_2$ which is narrower than the exposed dimension $D_1$.

Figure 12:
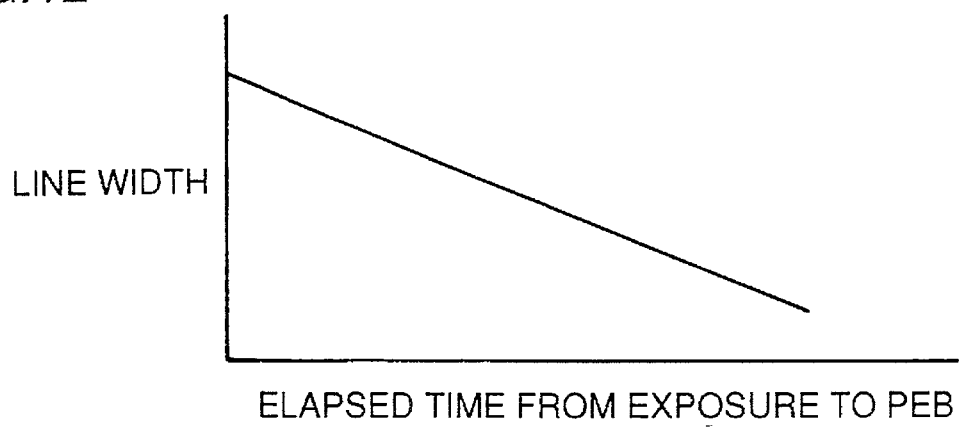
FIG. 12 illustrates the relation between an elapsed time from exposure to PEB and the line width of a resist pattern as formed in relation to a chemical amplification resist employed in the embodiment 1.

FIG. 12 illustrates the relation between the elapsed time from the exposure (see FIG. 1B) to the PEB (see FIG. 1C) and the width ($D_2$) of the resist pattern 1a as finished under the same PEB conditions. As clearly understood from FIG. 12, the line width ($D_2$) of the finished resist pattern 1a is linearly and regularly reduced with increase of the elapsed time from the exposure to the PEB.

According to the method shown in FIGS. 1A to 1D, therefore, it is possible to obtain a pattern having a line width ($D_2$) which is finer than the minimum resolution ($D_1$) obtained in performance of an apparatus therefor.

Figure 16:
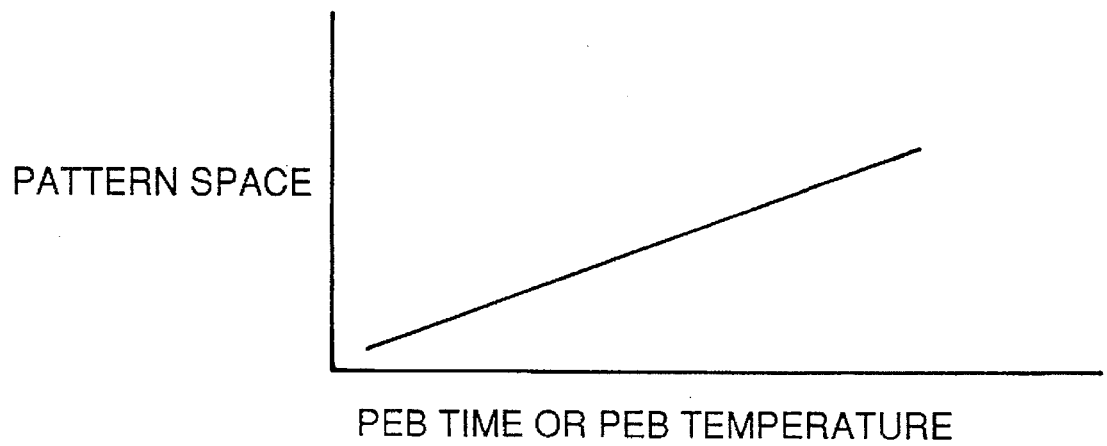
FIG. 16 illustrates the relation between a PEB temperature or a PEB time and a space of a resist pattern as formed in relation to the chemical amplification resist employed in the embodiment 1 or 6.

FIG. 16 illustrates the relation between the temperature or the time for the PEB (see FIG. 1C) and the dimension ($D_2$) of the finished resist pattern 1a. The dimension ($D_2$) of the finished resist pattern 1a is regularly and linearly increased with increase of the temperature or the time for the PEB.

Even if the dimension of the finished resist pattern 1a is narrowed through the elapsed time from the exposure to the PEB, therefore, it is possible to recover the dimension to a prescribed value by increasing the temperature or the time for the PEB. Thus, it is possible to enlarge the time margin from the exposure to the PEB.

While the exposure light is prepared from an electron beam in the aforementioned embodiment, the present invention is not restricted to this.

Embodiment 2

Contrarily to the embodiment 1, an embodiment 2 of the present invention relates to employment of such a negative chemical amplification resist that the finished dimension (line width) of a pattern as formed is thickened with increase of an elapsed time from exposure to PEB.

Figure 13:
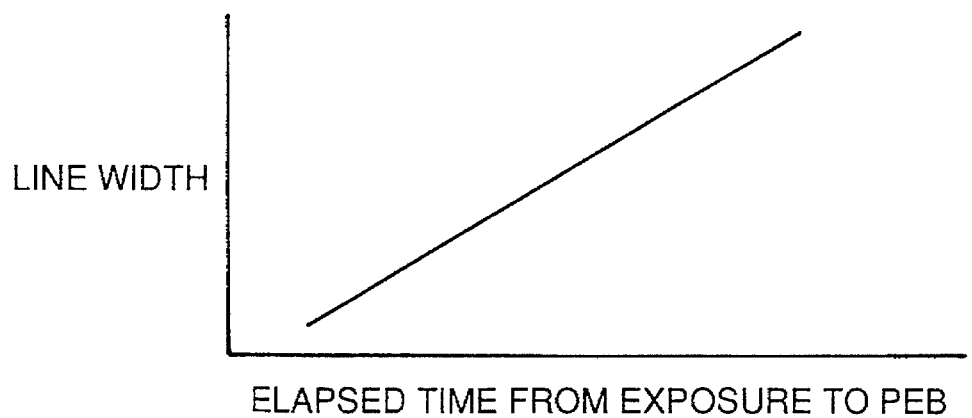
FIG. 13 illustrates the relation between an elapsed time from exposure to PEB and the line width of a resist pattern as formed in relation to a chemical amplification resist employed in the embodiment 2.

First, prepared is a negative chemical amplification resist having such a property that the finished dimension (line width) of a pattern as formed is thickened with increase of an elapsed time from exposure to PEB (hereinafter simply referred to as a resist 21) as shown in FIG. 13.

Figure 2:
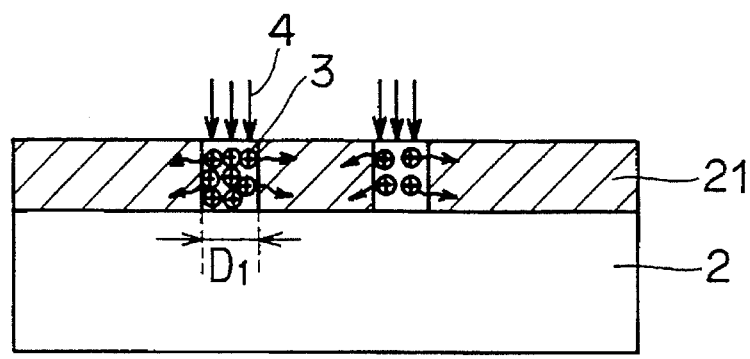
FIG. 2 is a sectional view of a semiconductor device showing a first step of a method according to an embodiment 2 of the present invention.

Referring to FIG. 2, the resist 21 is formed on a wafer 2. This resist 21 is selectively irradiated with an electron beam 4, whereby an acid 3 is generated in an exposed part of the resist 21. In consideration of the relation shown in FIG. 13, the resist 21 is left standing for a constant time from the exposure to PEB. Due to this standing, the acid 3 generated in the exposed part is transversely diffused. This resist 21 has acid concentration which is necessary for bridging the same in the exposed part as well as in the diffused part even after the diffusion of the acid 3, due to original generation of a sufficiently large amount of acid 3. Thereafter PEB treatment is performed (not shown).

Figure 3:
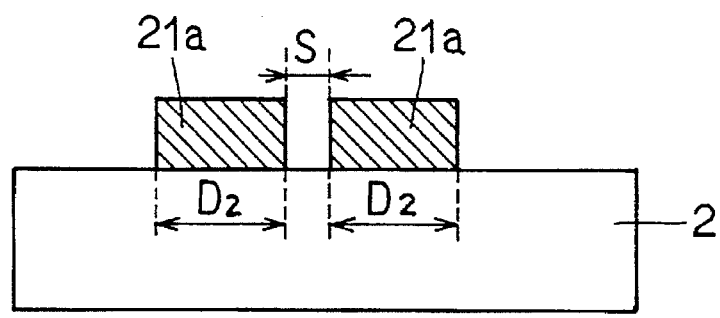
FIG. 3 is a sectional view of the semiconductor device showing a second step of the method according to the embodiment 2 of the present invention.

Referring to FIG. 3, the resist 21 is so developed as to obtain a resist pattern 21a having a dimension ($D_2$) which is larger than an exposed dimension $D_1$. In another viewpoint, it is understood possible to obtain the resist pattern 21a having a space S which is finer than the minimum resolution obtained in performance of an apparatus therefor, according to this method.

Embodiment 3

An embodiment 3 of the present invention relates to utilization of thickening of a pattern due to diffusion of an acid during PEB.

Figure 4:
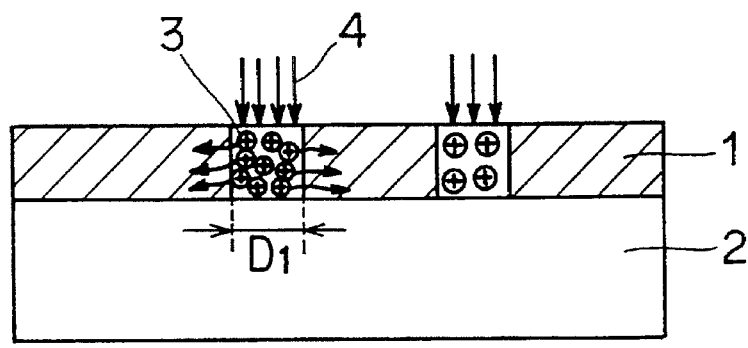
FIG. 4 is a sectional view of a semiconductor device showing a first step of a method according to an embodiment 3 of the present invention.
Figure 14:
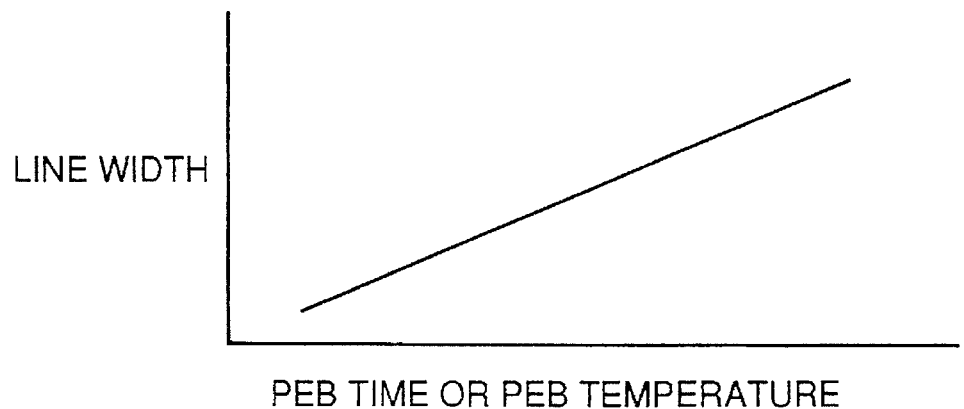
FIG. 14 illustrates the relation between a PEB temperature or a PEB time and the line width of a resist pattern as formed in relation to a chemical amplification resist employed in the embodiment 3.

Referring to FIG. 4, a negative chemical amplification resist 1 (hereinafter simply referred to as a resist 1) is formed on a wafer 2. The amplification resist 1 is selectively irradiated with an electron beam 4. At this time, the resist 1 is so exposed that a pattern as formed is narrower than a previously required finished dimension, or at a small exposure value. Thus, an acid 3 is generated in an exposed part. Thereafter PEB is carried out at a high temperature or for a long time, thereby transversely diffusing the acid 3. Due to this diffusion, the line width is regularly increased with increase of the PEB temperature or the PEB time, as shown in FIG. 14.

Figure 5:
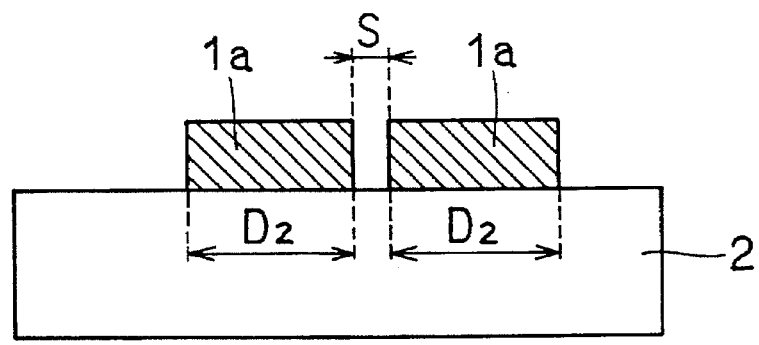
FIG. 5 is a sectional view of the semiconductor device showing a second step of the method according to the embodiment 3 of the present invention.

Referring to FIG. 5, the resist 1 is so developed as to obtain a resist pattern 1a having a dimension $D_2$ which is larger than an exposed dimension $D_1$. According to this method, it is possible to improve sensitivity of the resist 1. Namely, it is possible to form the resist pattern 1a which can sufficiently withstand employment at a small exposure value. In another viewpoint, it is understood possible to obtain the fine resist pattern 1a having a smaller space S than the minimum resolution which can be obtained in performance of an apparatus therefor, since the resist pattern 1a is thickened.

Embodiment 4

An embodiment 4 of the present invention employs a positive chemical amplification resist. The positive chemical amplification resist is now described in advance of concrete description of this embodiment.

Figure 17A:
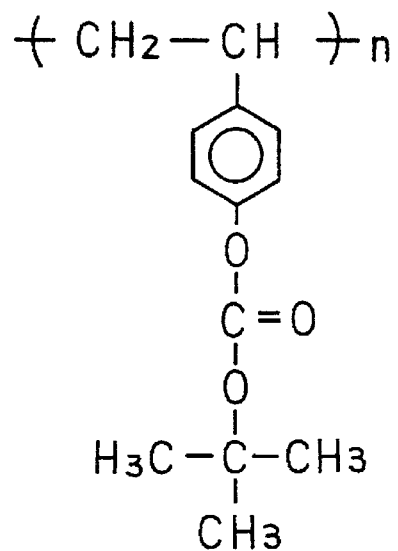
FIGS. 17A and 17B illustrate chemical structural formulas of a base resin and an acid generator forming a positive chemical amplification resist employed in the embodiment 4 respectively.
Figure 17B:
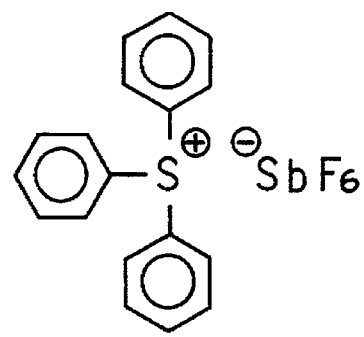
Figure 18:
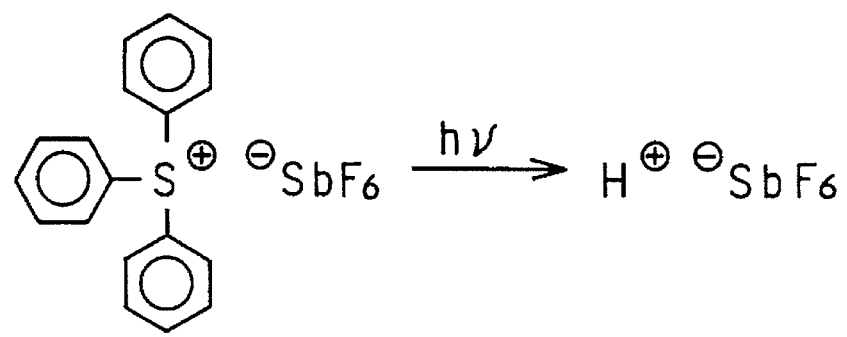
FIG. 18 illustrates a reaction formula of photolysis of triphenylsulfonium hexafluoroantimonate.

FIGS. 17A and 17B illustrate chemical structural formulas of a base resin and an acid generator forming the positive chemical amplification resist. It is clearly understood from FIG. 17A that the base resin is poly(p-t-butyloxycarbonyloxystyrene) in which t-butyloxycarbonyl (hereinafter referred to as t-BOC group) is bonded with poly-p-hydroxystyrene). Referring to FIG. 17A, n represents a natural number expressing the degree of polymerization. On the other hand, the acid generator shown in FIG. 17B is triphenylsulfonium hexafluoroantimonate. As shown in FIG. 18, the triphenylsulfonium hexafluoroantimonate generates protonic acid upon irradiation with light.

Figure 19:
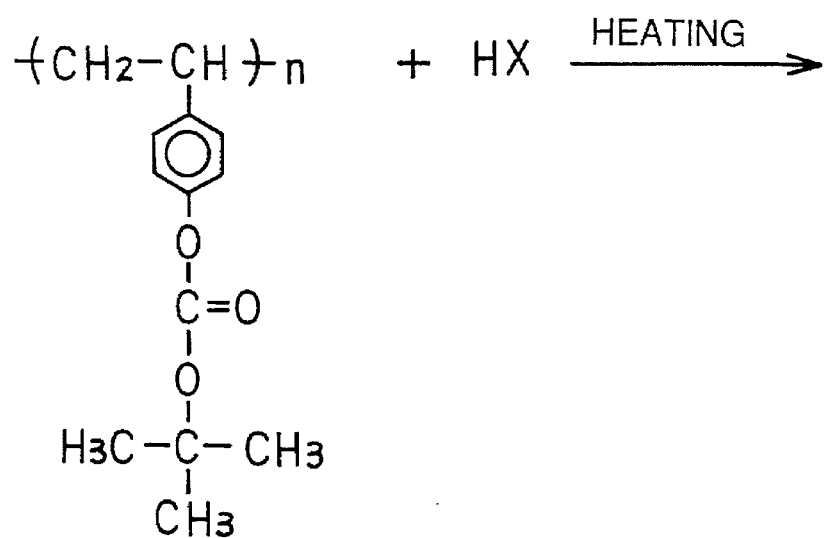
FIG. 19 illustrates a reaction formula showing such a reaction that poly(p-t-butyloxycarbonyloxystyrene) decomposes into poly-p-hydroxystyrene by an acid.
Figure 19:
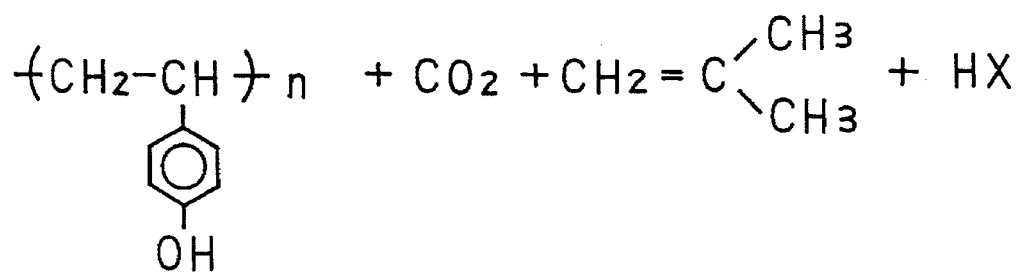

The protonic acid eliminates the t-BOC groups from the poly(p-t-butyloxycarbonyloxystyrene) and generates hydroxyl groups (phenol groups), along a reaction formula shown in FIG. 19. Poly-p-hydroxystyrene as generated is soluble in alkali.

Figure 20:
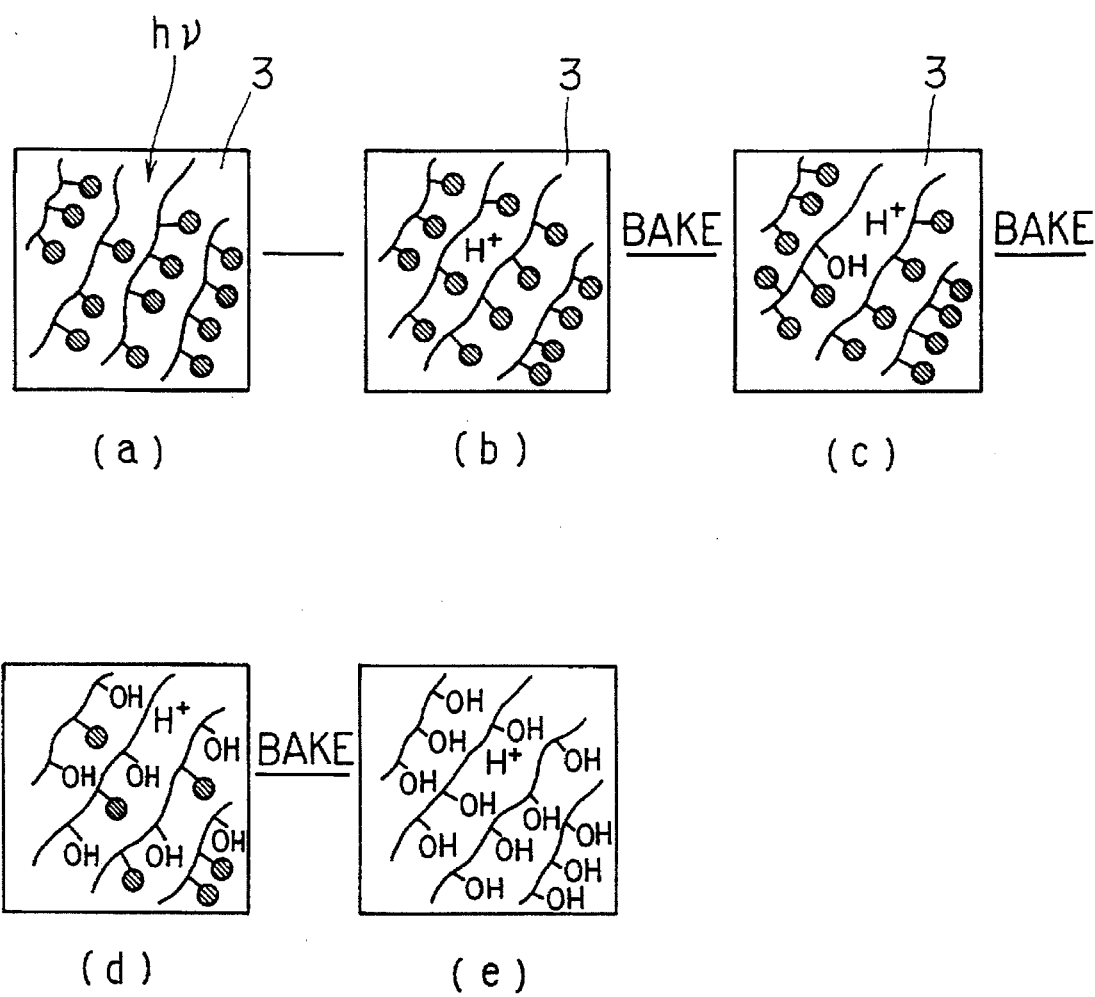
FIG. 20 illustrates such a state that t-BOC groups contained in a base resin are eliminated by an acid catalyst.
Figure 20:
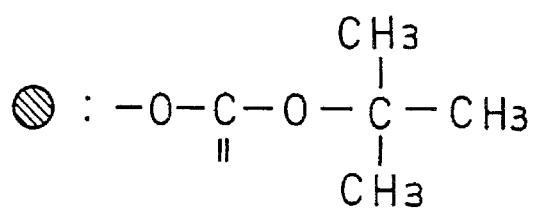

Such elimination of the t-BOC groups from the base resin with an acid catalyst is now described in further detail with reference to FIG. 20 Referring to FIG. 20(a), the positive chemical amplification resist is irradiated with an electron beam. Thus, the triphenylsulfonium hexafluoroantimonate contained in the positive chemical amplification resist decomposes to generate protonic acid, as shown in FIG. 20(b). Referring to FIG. 20(c), the positive chemical amplification resist is so baked as to eliminate the t-BOC groups from the poly(p-t-butyloxycarbonyloxystyrene) and to generate hydroxyl groups. Referring to FIG. 20(d), the elimination of the t-BOC groups further progresses by continuous baking, whereby the base resin is finally converted to polyvinyl phenol which is soluble in an alkaline developing solution as shown in FIG. 20(e).

The embodiment 4 employs the aforementioned positive chemical amplification resist, particularly such a positive resist that a space in a finished resist pattern is widened during an elapsed time from exposure to PEB.

Such a positive resist is now described. In order to convert the poly(p-t-butyloxycarbonyloxystyrene) to polyvinyl phenol, a certain amount of acid is necessary. If acid concentration is smaller than the "certain amount", the aforementioned conversion is incomplete. When the resist is left standing from the exposure to the PEB, the acid generated by light is transversely diffused. Throughout the specification, such a positive resist that acid concentration is reduced below the aforementioned "certain amount" in an exposed part due to such diffusion of the acid is referred to as a resist having such a property that a space in a pattern as formed is narrowed by standing from exposure to PEB. Further, such a resist that acid concentration is sufficiently higher than the aforementioned "certain amount" in an exposed part and that in a diffused part is also higher than the aforementioned "certain amount" due to original generation of a sufficiently large amount of acid is also referred to as a resist having such a property that a space in a pattern as formed is narrowed by standing from exposure to PEB.

Figure 6:
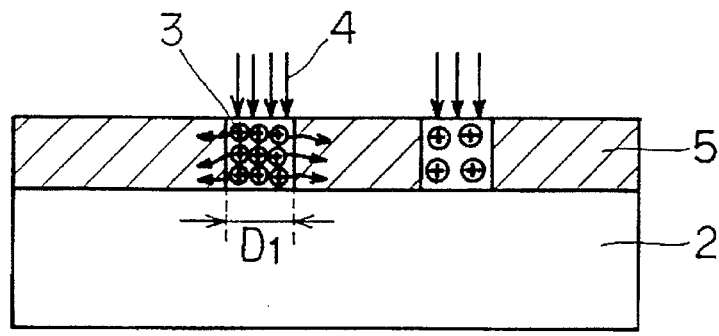
FIG. 6 is a sectional view of a semiconductor device showing a first step of a method according to an embodiment 4 of the present invention.

Referring to FIG. 6, a positive chemical amplification resist 5 (hereinafter simply referred to as a resist 5) is applied onto a wafer 2. This resist 5 is selectively irradiated with an electron beam 4, so that an acid 3 is generated in an exposed part through this irradiation.

The resist 5 is left standing for a constant time from the exposure to PEB. Through this standing, the acid 3 generated in the exposed part is transversely diffused.

Figure 15:
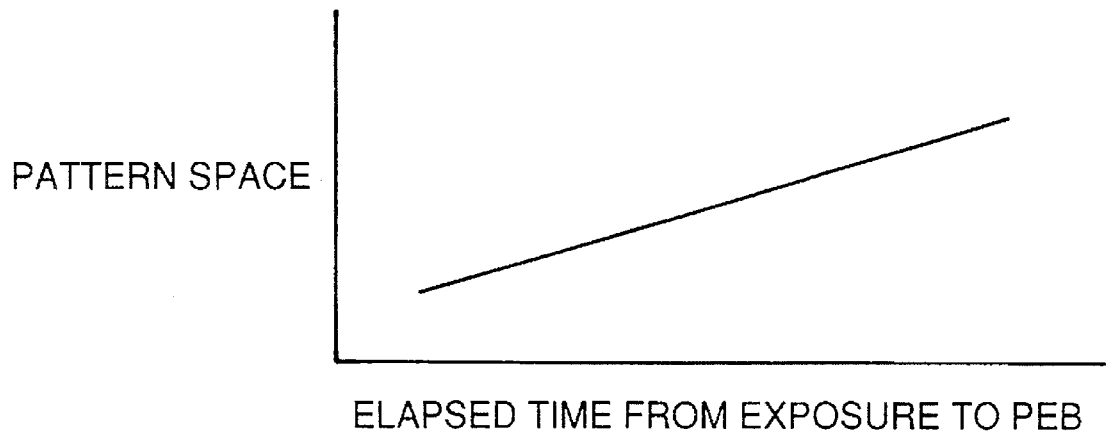
FIG. 15 illustrates the relation between an elapsed time from exposure to PEB and a space of a resist pattern as formed in relation to a chemical amplification resist employed in the embodiment 4.

FIG. 15 illustrates the relation between the elapsed time from the exposure to the PEB and a space in a finished resist pattern. It is clearly understood from FIG. 15 that the space is linearly increased with increase of the elapsed time from the exposure to the PEB.

Figure 7:
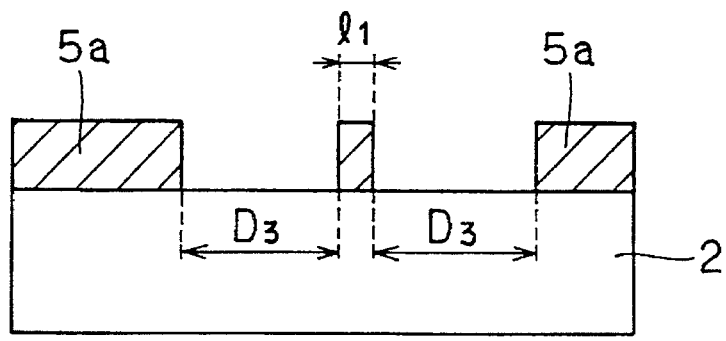
FIG. 7 is a sectional view of the semiconductor device showing a second step of the method according to the embodiment 4 of the present invention.

Referring again to FIG. 6, the resist 5 is irradiated with the electron beam 4 in a dimension which is smaller than a previously required one or at a small exposure value through the property that the space is widened by standing from the exposure to the PEB, and thereafter left standing for a constant time. Thereafter a time resolvable with the required dimension is obtained with reference to FIG. 15 to carry out the PEB for the time as obtained, and thereafter the resist 5 is developed. Thus, a resist pattern 5a having a prescribed space $D_3$ is obtained as shown in FIG. 7.

According to this method, it is possible to form the resist pattern 5a having an arbitrary space by measuring the standing time from the exposure to the PEB. It is not necessary to carry out the PEB immediately after the exposure, whereby the time margin for the process can be enlarged. In another viewpoint, it is understood possible to form a fine resist pattern having a dimension $1_1$ which is smaller than the minimum resolution obtained in performance of an apparatus therefor.

Embodiment 5

Figure 8:
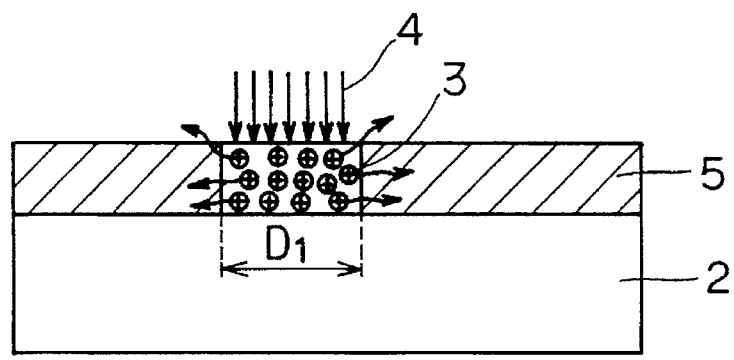
FIG. 8 is a sectional view of a semiconductor device showing a first step of a method according to an embodiment 5 of the present invention.
Figure 9:
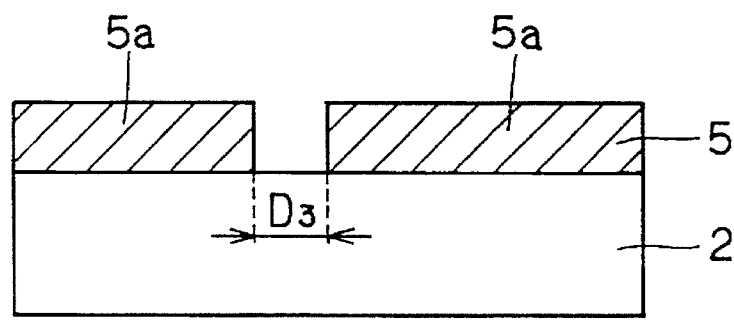
FIG. 9 is a sectional view of the semiconductor device showing a second step of the method according to the embodiment 5 of the present invention.

An embodiment 5 of the present invention employs such a positive chemical amplification resist that a space in a resist pattern as formed is narrowed through an elapsed time from exposure to PEB. Referring to FIG. 8, a positive chemical amplification resist 5 is formed on a wafer 2. The resist 5 is irradiated with an electron beam 4 in a dimension $D_1$ which is larger than a previously required dimension $D_3$ or at a large exposure value, through the property that the space in the resist pattern is narrowed by standing from the exposure to the PEB.

Thereafter the resist 5 is left standing for a constant time. A time resolvable with the required dimension ($D_3$) is obtained with reference to the relation between the elapsed time from the exposure to the PEB and the space to carry out the PEB for the time as obtained, and thereafter the resist 5 is developed. Thus, a resist pattern 5a having a space $D_3$ which is smaller than the exposed dimension $D_1$ is obtained. According to this method, it is possible to obtain the resist pattern 5a having the arbitrary space $D_3$ by adjusting the elapsed time from the exposure to the PEB. In another viewpoint, it is possible to obtain the resist pattern 5a having the smaller space $D_3$ than the minimum resolution which is obtained in performance of an apparatus therefor.

Embodiment 6

An embodiment 6 of the present invention relates to employment of such a positive chemical amplification resist that a space in a resist pattern as formed is widened with increase of a PEB time or a PEB temperature.

Figure 10:
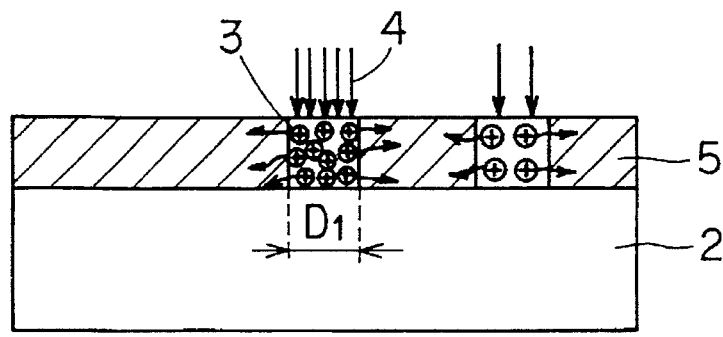
FIG. 10 is a sectional view of a semiconductor device showing a first step of a method according to an embodiment 6 of the present invention.

Referring to FIG. 10, a positive chemical amplification resist 5 having such a property that an acid as generated is transversely diffused with increase of a PEB time or a PEB temperature to widen a space in a resist pattern is formed on a wafer 2. The positive chemical amplification resist 5 is selectively irradiated with an electron beam 4. The electron beam 4 is applied in a dimension $D_l$ which is smaller than a previously required finished dimension $D_3$ or at a small exposure value, through widening of the space which is caused by diffusion of an acid 3 during PEB. Thereafter the PEB is carried out at a high temperature or for a long time, to transversely diffuse the acid 3.

FIG. 16 illustrates the relation between the PEB temperature or the PEB time and the space in the finished resist pattern. The space is linearly increased with the increase of the PEB temperature or the PEB time.

Figure 11:
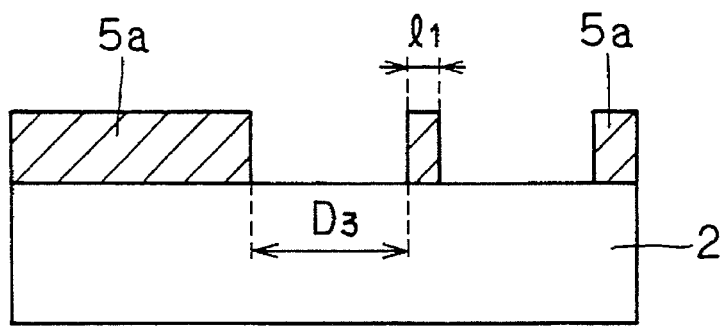
FIG. 11 is a sectional view of the semiconductor device showing a second step of the method according to the embodiment 6 of the present invention.

Referring to FIG. 11, the resist 5 is developed after the PEB which is carried out for a prescribed time, thereby obtaining a resist pattern 5a having a space $D_3$ which is predicted from the relation shown in FIG. 16.

According to this method, it is possible to attain improvement in sensitivity of the resist 5 since the exposure value can be reduced. In another viewpoint, it is understood possible to obtain the resist pattern 5a having a dimension $1_1$ which is finer than the minimum resolution obtained in performance of an apparatus therefor.

While the features of the embodiments 1 to 6 have been described, the present invention is not restricted to these but it is also possible to stably supply a finer resist pattern by properly combining the embodiments 1 to 6 with each other.

Embodiment 7

Figure 21:
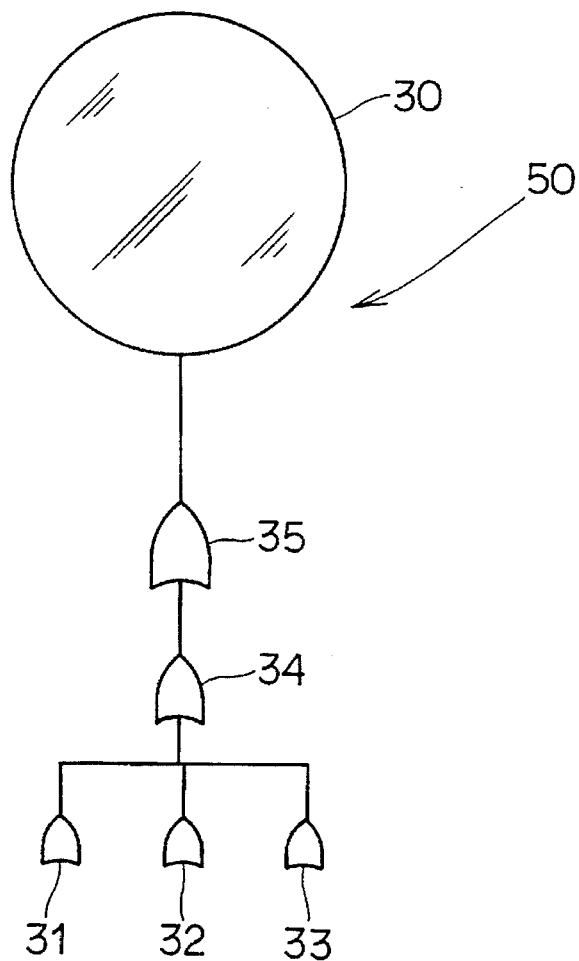
FIG. 21 is a conceptual diagram showing a postexposure baking apparatus according to an embodiment 7 of the present invention.

An embodiment 7 of the present invention relates to an apparatus 50 for postexposure-baking an exposed chemical amplification resist. FIG. 21 is a conceptual diagram of this apparatus 50. The apparatus 50 comprises amplification resist. The apparatus 50 also comprises first input means 31 for inputting the relation between an elapsed time from exposure to PEB and the line width or a space of a resist pattern as finished as to the chemical amplification resist in the apparatus 50. The apparatus 50 further comprises second input means 32 for inputting the relation between the PEB temperature or the PEB time and the line width or the space of the resist pattern as finished as to the chemical amplification resist in the apparatus 50. The apparatus 50 further comprises third input means 33 for inputting the elapsed time from the exposure to the PEB. The apparatus 50 further comprises calculation means 34 for calculating the optimum PEB temperature or the optimum PEB time for obtaining a resist pattern having a desired line width or a desired space on the basis of the data inputted by the first, second and third input means 31, 32 and 33. The apparatus 50 further comprises control means 35 for controlling the hot plate 30 to be capable of postexposure-baking the chemical amplification resist at or for the temperature or the time obtained by the calculation means 34.

Figure 22:
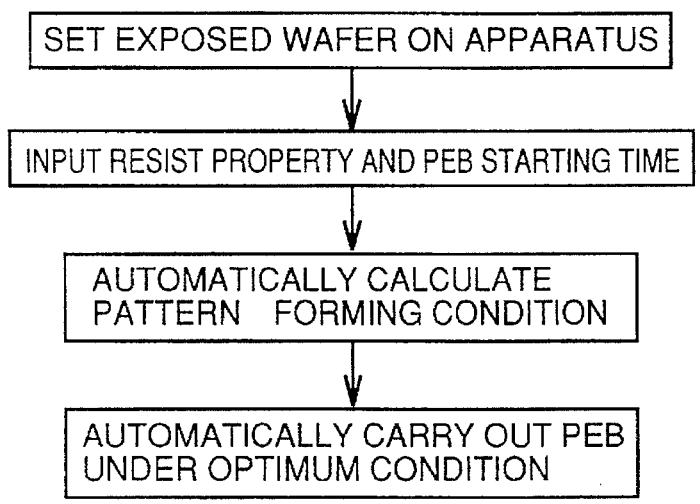
FIG. 22 is an operation flow chart of the postexposure baking apparatus according to the embodiment 7.

FIG. 22 is an operation flow chart of this apparatus 50. The operation of the apparatus 50 is now described with reference to FIGS. 21 and 22. First, an exposed wafer is placed on the hot plate 30. The first input means 31 inputs the relation between the elapsed time from the exposure to the PEB and the line width or the space of a resist pattern as finished as to the chemical amplification resist as employed. The second input means 32 inputs the relation between the PEB temperature or the PEB time and the line width or the space of the finished resist pattern as to the chemical amplification resist as employed. The third input means 33 inputs the elapsed time from the exposure to the PEB. The calculation means 34 calculates the optimum PEB temperature or the optimum PEB time for obtaining a resist pattern having a desired line width or a desired space on the basis of the data inputted by the first, second and third input means 31, 32 and 33. The hot plate 30 is controlled to be capable of postexposure-baking the chemical amplification resist at or for the temperature or the time obtained by the calculation means 34.

This apparatus 50 has the following advantage. Namely, it is possible to prevent dispersion in pattern dimension caused by difference in elapsed time between an initially exposed wafer and a finally exposed wafer in electron beam exposure requiring a long exposure time or the like, so that all wafers are exposed under the same exposure conditions.

Embodiment 8

An embodiment 8 of the present invention relates to a concrete example of the hot plate employed in the embodiment 7.

Figure 23:
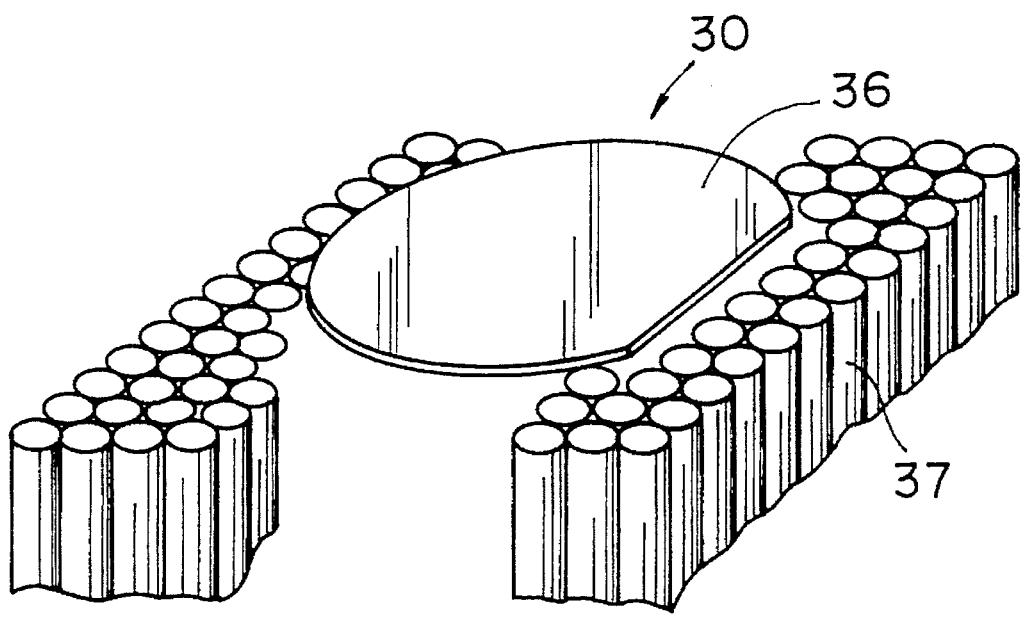
FIG. 23 is a perspective view showing a hot plate according to an embodiment 8.
Figure 24:
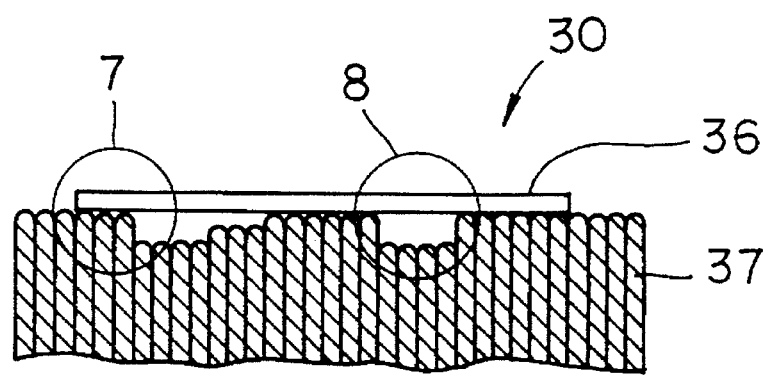
FIG. 24 is a sectional view of the hot plate shown in FIG. 23.

Referring to FIG. 23, a hot plate 30 according to this embodiment comprises a plurality of vertically movable heating pins 37 which are brought into contact with the rear surface of a wafer 36. The heating pins 37 are freely controlled in temperature. Referring to FIG. 24, the heating pins 37 are partially vertically moved to form portions 7 and 8 which are in contact and not in contact with the heating pins 37 in the wafer 36, thereby intentionally forming temperature distribution.

When a fine pattern is formed on the wafer 36, there are provided various portions including that of 0.1 μm, for example, which is at the limit of resolution, and that of 0.8 82 m, for example, which is not at the limit of the resolution. It is effective to form the temperature distribution through the hot plate 30 according to this embodiment, in formation of such a fine pattern.

Embodiment 9

An embodiment 9 of the present invention relates to another concrete example of the hot plate employed in the embodiment 7.

Figure 25:
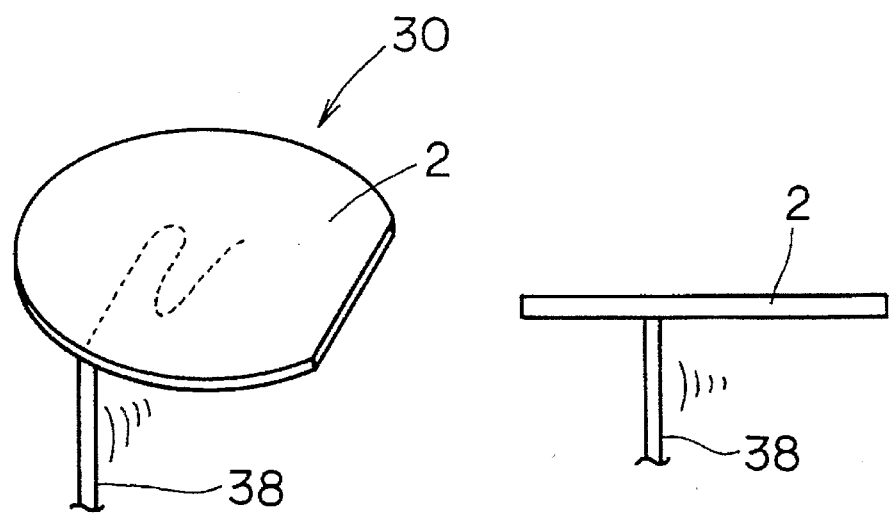
FIG. 25 shows a perspective view and a side elevational view of a hot plate according to an embodiment 9 of the present invention.

Referring to FIG. 25, a hot plate 30 according to this embodiment comprises a horizontally movable heating pin 38 which is brought into contact with the rear surface of a wafer 2. A fixed base (not shown) of a heat insulating material or the like is provided around the heating pin 38 for supporting the wafer 2 from below and preventing thermal diffusion.

Figure 26:
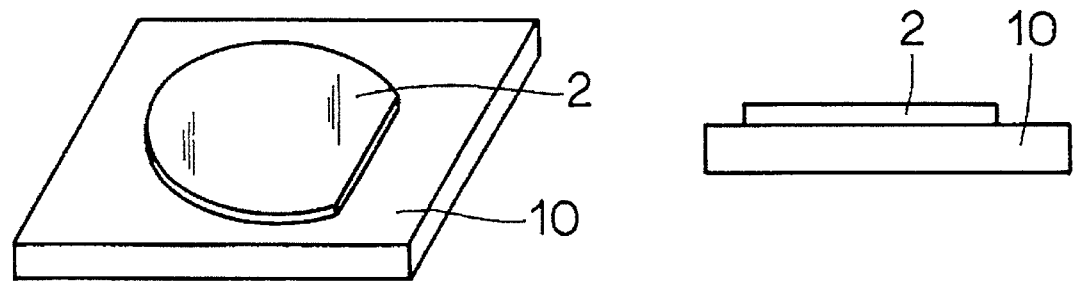
FIG. 26 illustrates a wafer which is heated on an ordinary hot plate.
Figure 27:
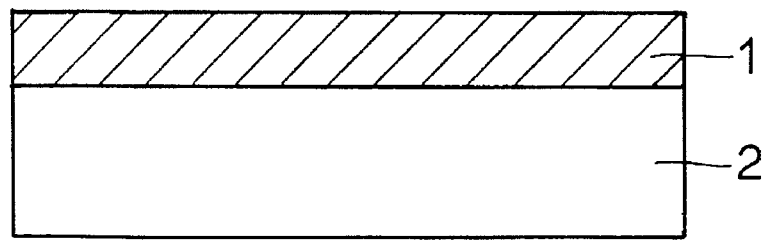
FIG. 27 is a sectional view of a semiconductor device showing a first step of a conventional method of forming a fine resist pattern employing a chemical amplification resist.
Figure 28:
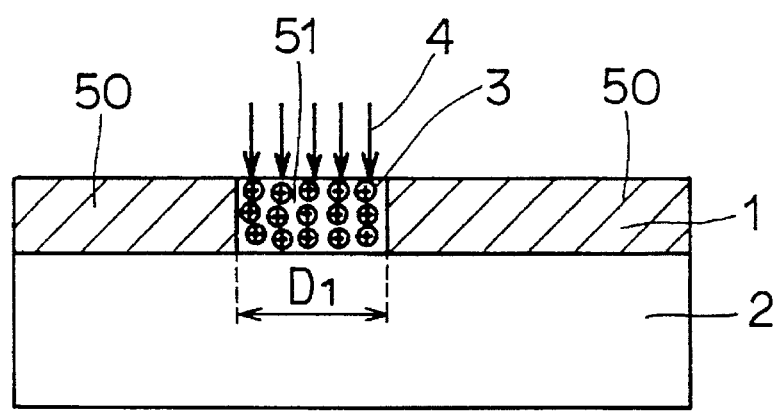
FIG. 28 is a sectional view of the semiconductor device showing a second step of the conventional method of forming a fine resist pattern.
Figure 29:
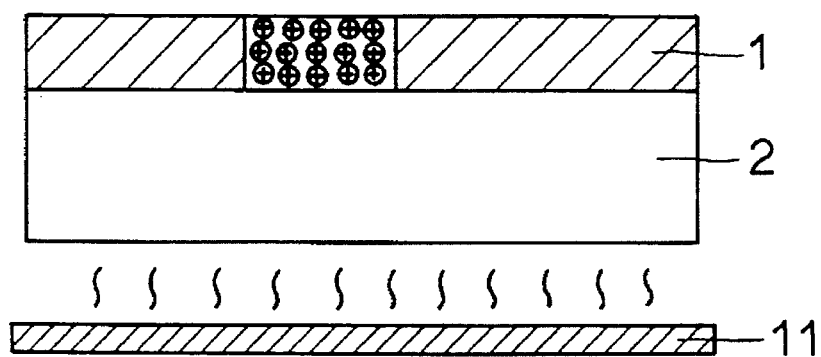
FIG. 29 is a sectional view of the semiconductor device showing a third step of the conventional method of forming a fine resist pattern.
Figure 30:
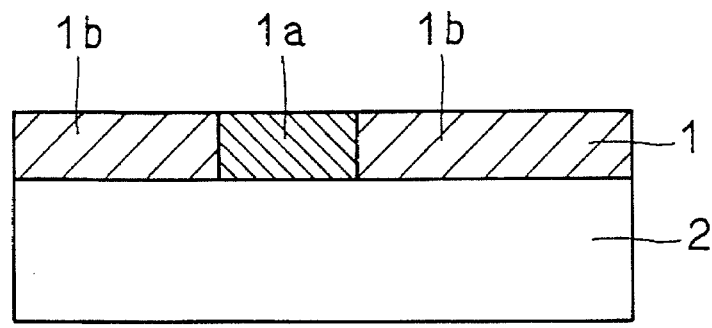
FIG. 30 is a sectional view of the semiconductor device showing a fourth step of the conventional method of forming a fine resist pattern.
Figure 31:
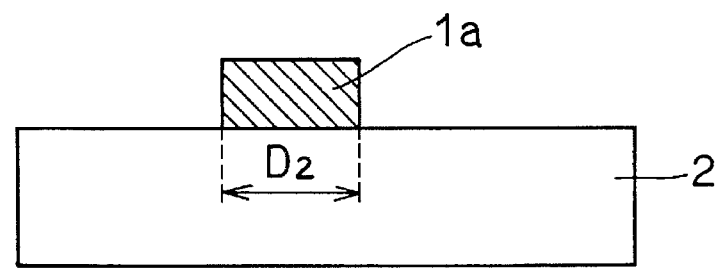
FIG. 31 is a sectional view of the semiconductor device showing a fifth step of the conventional method of forming a fine resist pattern.
Figure 32A:
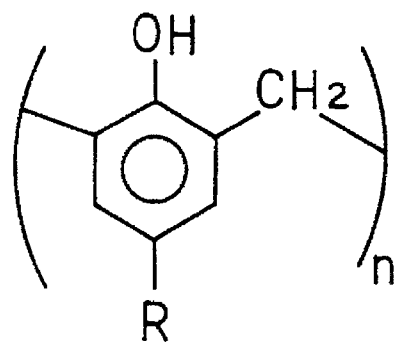
FIGS. 32A to 32C illustrate chemical structural formulas of a base resin, a cross-linking agent and an acid generator which are contained in the conventional chemical amplification resist.
Figure 32B:
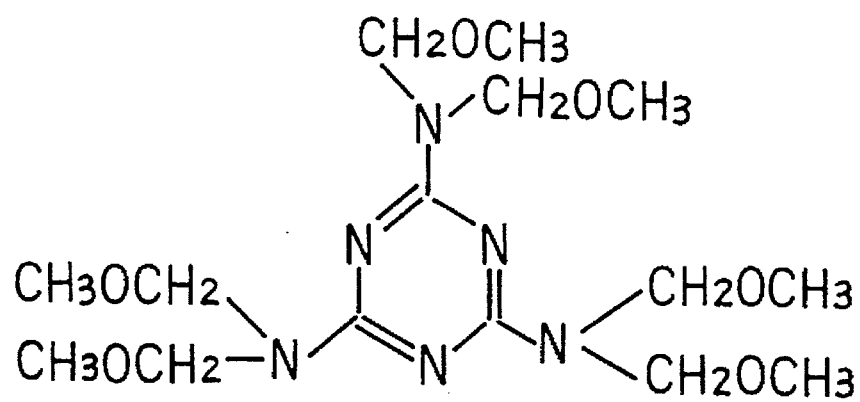
Figure 32C:
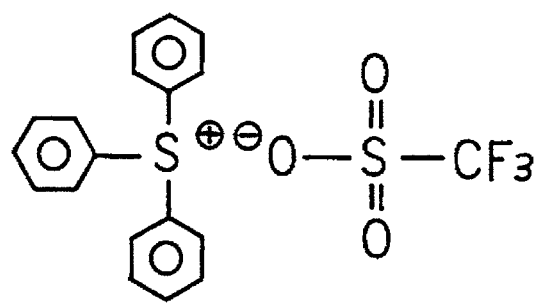
Figure 33:
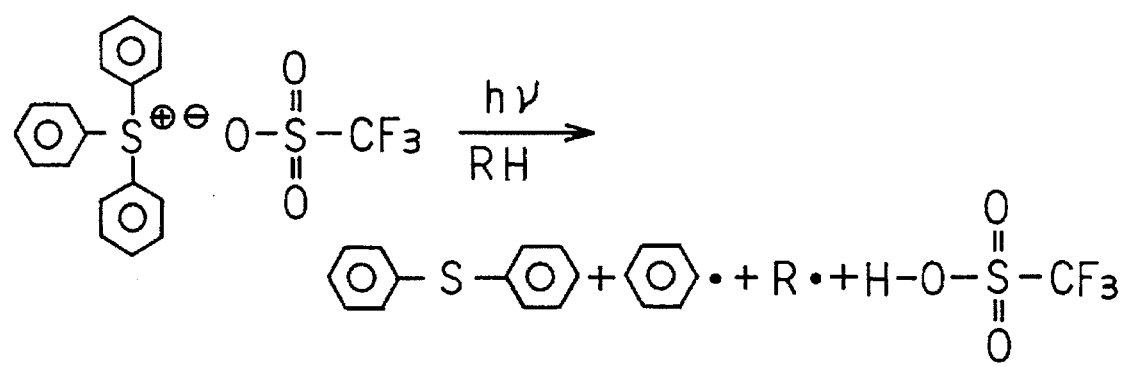
FIG. 33 illustrates a reaction formula of photolysis of triphenylsulfonium triflate.

The operation is now described. The hot plate 30 shown in FIG. 25 is employed to locally bake the wafer 2. Referring to FIG. 26, the overall wafer 2 is thereafter baked through an ordinary hot plate 10 at a low temperature. Thus, it is possible to bake the wafer 2 while locally changing heated states.

While heating pins are employed in the embodiments 8 and 9, the present invention is not restricted to these but heating means having spherical portions to be contact with the wafer 36 or 2 attains an effect similar to those of the embodiments 8 and 9.

In the method of forming a fine resist pattern according to the first aspect of the present invention, the aforementioned chemical amplification resist is postexposure-baked under the conditions which are decided on the basis of the relation between the elapsed time from the exposure to the postexposure baking and the change of the line width or the space of the finished resist pattern as to the chemical amplification resist for obtaining a resist pattern having a desired line width or a desired space, whereby it is possible to arbitrarily control the dimension of the resist pattern without performing the postexposure baking immediately after the exposure.

In the method of forming a fine resist pattern according to the second aspect of the present invention, the chemical amplification resist is postexposure-baked under the conditions which are decided on the basis of the relation between the temperature or the time for the postexposure baking and the change of the line width or the space of the finished resist pattern as to the chemical amplification resist for obtaining a resist pattern having a desired line width or a desired space, whereby it is possible to obtain a pattern which is finer than the minimum resolution obtained in performance of an apparatus therefor.

In the postexposure baking apparatus according to the third aspect of the present invention, the chemical amplification resist can be baked at the temperature or for the time of the postexposure baking for obtaining a resist pattern having a desired line width or a desired space, whereby it is possible to arbitrarily control the dimension of the resist pattern without performing the postexposure baking immediately after the exposure, as well as to obtain a pattern which is finer than the minimum resolution obtained in performance of the apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A postexposure baking apparatus for postexposure-baking an exposed chemical amplification resist on a front surface of a wafer, said apparatus comprising:

a hot plate for postexposure-baking said exposed chemical amplification resist;

first input means for inputting a relation between an elapsed time from exposure to said postexposure baking and change of a line width of a resist pattern as finished as to said chemical amplification resist in said apparatus;

second input means for inputting a relation between a temperature for said postexposure baking and said change of said line width of said resist pattern as finished as to said chemical amplification resist in said apparatus;

calculation means for calculating said temperature for said postexposure baking for obtaining a resist pattern having a desired line width on the basis of information being inputted by said first input means and that being inputted by said second input means; and control means for controlling said hot plate to be capable of postexposure-baking said chemical amplification resist at or for said temperature being obtained by said calculation means.

2. A postexposure baking apparatus in accordance with claim 1, wherein said hot plate comprises a plurality of vertically movable heating pins being in contact with the a surface of said wafer.

3. A postexposure baking apparatus in accordance with claim 1, wherein said hot plate comprises a horizontally movable heating pin being in contact with a rear surface of said wafer.

4. A postexposure baking apparatus for postexposure-baking an exposed chemical amplification resist on a front surface of a wafer, said apparatus comprising:

a hot plate for postexposure-baking said exposed chemical amplification resist;

first input means for inputting a relation between an elapsed time from exposure to said postexposure baking and change of a space of a resist pattern as finished as to said chemical amplification resist in said apparatus;

second input means for inputting a relation between a temperature for said postexposure baking and said change of said space of said resist pattern as finished as to said chemical amplification resist in said apparatus;

calculation means for calculating said temperature for said postexposure baking for obtaining a resist pattern having a desired space on the basis of information being inputted by said first input means and that being inputted by said second input means; and control means for controlling said hot plate to be capable of postexposure-baking said chemical amplification resist at or for said temperature being obtained by said calculation means.

5. A postexposure baking apparatus for postexposure-baking an exposed chemical amplification resist on a front surface of a wafer, said apparatus comprising:

a hot plate for postexposure-baking said exposed chemical amplification resist;

first input means for inputting a relation between an elapsed time from exposure to said postexposure baking and change of a line width of a resist pattern as finished as to said chemical amplification resist in said apparatus;

second input means for inputting a relation between a time for said postexposure baking and said change of said line width of said resist pattern as finished as to said chemical amplification resist in said apparatus;

calculation means for calculating said time for said postexposure baking for obtaining a resist pattern having a desired line width on the basis of information being inputted by said first input means and that being inputted by said second input means; and control means for controlling said hot plate to be capable of postexposure-baking said chemical amplification resist at or for said time being obtained by said calculation means.

6. A postexposure baking apparatus for postexposure-baking an exposed chemical amplification resist on a front surface of a wafer, said apparatus comprising:

a hot plate for postexposure-baking said exposed chemical amplification resist;

first input means for inputting a relation between an elapsed time from exposure to said postexposure baking and change of a space of a resist pattern as finished as to said chemical amplification resist in said apparatus;

second input means for inputting a relation between a time for said postexposure baking and said change of said space of said resist pattern as finished as to said chemical amplification resist in said apparatus;

calculation means for calculating said time for said postexposure baking for obtaining a resist pattern having a desired space on the basis of information being inputted by said first input means and that being inputted by said second input means; and control means for controlling said hot plate to be capable of postexposure-baking said chemical amplification resist at or for said time being obtained by said calculation means.

* * * * *